United States Patent
Sadeghian Marnani et al.

(10) Patent No.: US 12,346,036 B2
(45) Date of Patent: Jul. 1, 2025

(54) ALIGNMENT SYSTEM AND METHOD FOR ALIGNING AN OBJECT HAVING AN ALIGNMENT MARK

(71) Applicant: Nearfield Instruments B.V., Rotterdam (NL)

(72) Inventors: Hamed Sadeghian Marnani, Rotterdam (NL); Taras Piskunov, Schiedam (NL); Erik Tabak, Rotterdam (NL)

(73) Assignee: Nearfield Instruments B.V., Rotterdam (NL)

( * ) Notice: Subject to any disclaimer, the term of this patent is extended or adjusted under 35 U.S.C. 154(b) by 142 days.

(21) Appl. No.: 18/037,939

(22) PCT Filed: Nov. 19, 2021

(86) PCT No.: PCT/NL2021/050711
§ 371 (c)(1),
(2) Date: May 19, 2023

(87) PCT Pub. No.: WO2022/108449
PCT Pub. Date: May 27, 2022

(65) Prior Publication Data
US 2024/0004321 A1 Jan. 4, 2024

(30) Foreign Application Priority Data
Nov. 20, 2020 (NL) ...................................... 2026937

(51) Int. Cl.
*G03F 9/00* (2006.01)

(52) U.S. Cl.
CPC .......... *G03F 9/7088* (2013.01); *G03F 9/7065* (2013.01); *G03F 9/7073* (2013.01)

(58) Field of Classification Search
CPC .... G03F 9/7065; G03F 9/7073; G03F 9/7088; G03F 9/7092
See application file for complete search history.

(56) References Cited

U.S. PATENT DOCUMENTS 5,812,892 A * 9/1998 Miyoshi ................... B41J 2/451
396/548
2005/0270509 A1* 12/2005 Ogushi ................. G03F 9/7076
355/53

(Continued)

FOREIGN PATENT DOCUMENTS

| JP | H07142300 A | 6/1995 |
| JP | 2004259870 A | 9/2004 |

OTHER PUBLICATIONS

International Search Report and Written Opinion—PCT/NL2021/050711—mailing date May 27, 2022.

*Primary Examiner* — Peter B Kim
(74) *Attorney, Agent, or Firm* — Banner & Witcoff, Ltd.

(57) ABSTRACT

An alignment system and method for aligning an object (O) having an object marker. An image of the object marker is projected onto an imaging sensor (11) having sensor elements. At least one reference marker is projected onto the imaging sensor (11). Based on image output (111) from the imaging sensor (11), respective subsets of sensor elements are determined. Based on a first subset of the sensor elements, a marker position is determined where the image of the object marker is projected onto the imaging sensor (11). Based on a second subset (Sr) of the sensor elements, a reference position is determined where the reference marker is projected onto the imaging sensor (11). The marker position correlates with a position (Xm,Ym) of the object (O) whereas the reference position does not. The object position (Xm,Ym) is determined based on the marker position relative to the reference position.

20 Claims, 4 Drawing Sheets

(56) References Cited

U.S. PATENT DOCUMENTS

2007/0216890 A1 9/2007 Venema
2018/0246423 A1 8/2018 Mathijssen et al.

* cited by examiner

ALIGNMENT SYSTEM AND METHOD FOR ALIGNING AN OBJECT HAVING AN ALIGNMENT MARK

CROSS-REFERENCE TO RELATED APPLICATIONS

This application is a U.S. National Stage application under 35 U.S.C. § 371 of International Application PCT/NL2021/050711 (published as WO 2022/108449 A1), filed Nov. 19, 2021, which claims the benefit of priority to Application NL 2026937, filed Nov. 20, 2020. Each of these prior applications is hereby incorporated by reference in its entirety.

TECHNICAL FIELD AND BACKGROUND

The present disclosure relates to an alignment system and method for aligning an object having an alignment mark, in particular by imaging the alignment mark on a sensor, e.g. using an alignment microscope.

Alignment of objects is relevant in a large variety of fields and professions. For example, in the field of lithography it is particularly challenging to accurately align objects such as wafers. One way to align a wafer, is by using an alignment mark on the object which is imaged on a sensor surface. For example, the mark is observed via an optical microscope and the wafer is aligned with respect to a reference lithography mask, or other reference point. By determining a position of the marker image on a sensor, a corresponding position of the object can be derived. However, various circumstance can deteriorate an accuracy of the system.

There is a need for further improving alignment systems and methods for aligning an object having an alignment mark.

SUMMARY

The inventors recognize that, typically, the sensor in an imaging system is calibrated for specific operating conditions such as temperature. This may normally limit the applicability of such system within a small range of operating conditions. However, it may be difficult to perfectly control the operating conditions. For example, warm up of the system can affect components such as the sensor, e.g. causing a shift and/or deformation during operation. Also other (optical) components can be affected. It is therefore desirable to account for the influence of these thermal effects on the accuracy of the measurement of the positions of the object markers.

Aspects of the present disclosure relate to alignment systems and methods for aligning an object, in particular using an (optical) imaging system. Typically, an imaging system has an object plane where an object can be placed, and an imaging plane where an image of the object is projected (imaged). For example, the imaging system is configured to receive light from an object marker (defining a respective object position of the object in the object plane), and project an image of the object marker at a marker position onto an imaging sensor disposed in the imaging plane. So the position of the image, illuminating respective sensor elements in the imaging plane, correlates with the object position in the object plane. In principle the marker can be placed anywhere on the objection, e.g. having a known relation to the object position. As described herein, the alignment system further comprises a reference light source configured to project at least one reference marker at a reference position onto the imaging sensor, which reference position is independent of the object position in the object plane.

By using a combination of a (variable) object marker whose position depends on the object, and a (fixed) reference marker which is independent of the object, changes in the object marker position that are not a direct consequence of movement in the object can be compensated for, e.g. by determining the object position based on the imaged marker position relative to the reference position. For example, this can be used to compensate deviations in the expected position of the imaging sensor. For example, the sensing elements can be shifted as a result of heating the sensor. Also other systematic errors can be compensated. By projecting the reference light source through the same imaging system as the marker, also deviations in the projection can be detected and/or compensated.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1:
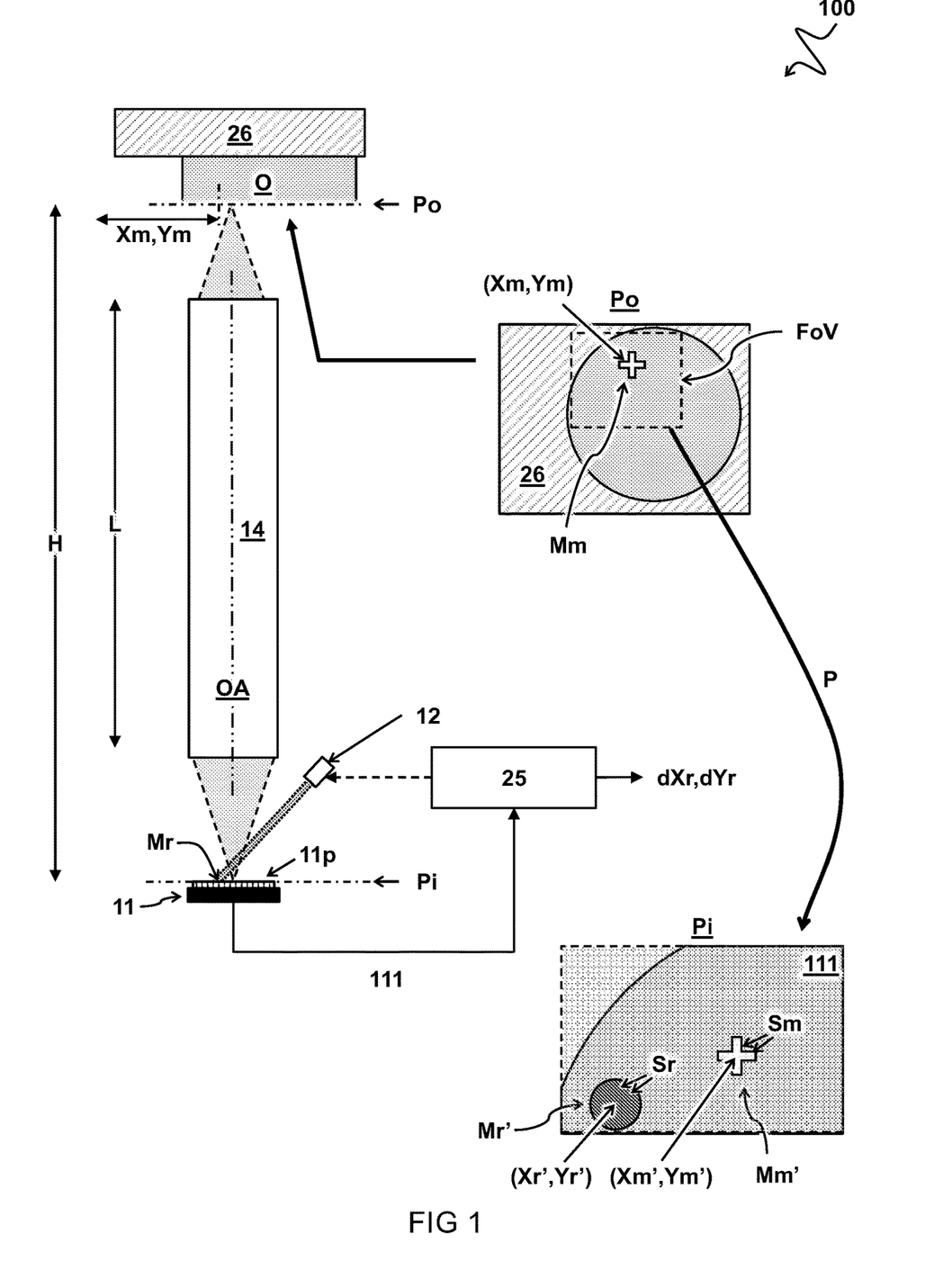
FIG. 1 illustrates an alignment system.

FIG. 1 illustrates an alignment system 100 for aligning an object "O". In some embodiments, the alignment system 100 is configured to measure a position and/or orientation of the object. In other or further embodiments, the alignment system 100 is configured to set and/or adjust alignment of the object, e.g. by controlling an (actuator in an) object stage 26 holding the object. In one embodiment, e.g. as shown, the alignment system 100 comprises an imaging sensor 11 with sensor elements 11p, e.g. pixels of an optical imaging sensor.

In a preferred embodiment, e.g. as shown, the alignment system 100 comprises an imaging system 14. Typically, the imaging system 14 has an object plane Po and an imaging plane Pi, and may comprise one or more optical components. In some embodiments, the imaging system 14 is configured to receive light from at least one object marker Mm defining a respective object position Xm,Ym of the object "O" in the object plane Po, and to project (indicated by "P") an image Mm' of the object marker at a marker position Xm',Ym' onto the imaging sensor 11. In this way a first subset Sm of the sensor elements in the imaging plane Pi is illuminated. As described herein, the marker position Xm',Ym' in the imaging plane Pi correlates with the object position Xm,Ym in the object plane Po.

In some embodiments, the imaging system 14 comprises or is essentially formed by a microscope. Typically, the microscope comprises a set of (one or more) optical elements (not individually shown here) which can act together to project a magnified image of the object. For example, the optical elements may include an objective, a tube lens, et cetera. In some embodiments, the optical components define an optical axis OA, e.g. along a length "L" of the microscope. Depending on the arrangement, the microscope can have a relatively large size, e.g. length "L" as indicated. This can determine a minimum height "H" which is needed to accommodate the system 100. Alternatively, or in addition to lenses, also other optics such as curved mirrors can be used.

Typically, the imaging system 14 and imaging sensor 11 have a specific field of view (FoV). For example, the field of view of the imaging system 14 is a fraction of the object size, e.g. due to the magnification of the imaging system 14 and/or size of the imaging sensor 11. For example, the imaging system 14 has magnification factor of at least two, three, five, ten, twenty, fifty, hundred, or more. The higher the magnification, the more precise can be the measurement. In some embodiments, the field of view can be extended by using two or more imaging systems (not shown) covering views at different location of the object "O". For example, each imaging system is configured to measure alignment of a respective one or more object markers.

In a preferred embodiment, the alignment system 100 comprises a reference light source 12 configured to project at least one reference marker Mr' at a reference position Xr',Yr' onto the imaging sensor 11. In this way, the light illuminates a second subset Sr of the sensor elements. As will be appreciated, the reference position Xr',Yr' in the imaging plane Pi is independent of the object position Xm,Ym in the object plane Po. So, preferably the projection of the reference marker has a fixed spatial location in the imaging plane, irrespective of possible shift of the sensor elements during operation of the alignment system (100). In one embodiment, e.g. as shown, the light of the reference light source 12 directly illuminates the imaging sensor 11, e.g. without passing through the imaging system 14.

Some embodiments comprise analyzing the image output 11I of the imaging sensor 11. For example, the respective subset Sm,Sr of sensor elements illuminated by the image Mm' of the object marker and the reference marker Mr', respectively, are determined based on the image output 11I and/or analysis. In one embodiment, assignment of the respective subsets to either the object marker Mm and the reference marker Mr' is determined based on a difference in shape, size, and/or orientation of the respective markers. In another or further embodiment, one or both of the reference light source 12 or an illumination light source (not shown here), used to illuminate the object marker Mm, is intensity modulated, e.g. turned on/off, to disambiguate the respective subset. Also other ways of disambiguation can be envisaged such as different wavelength and/or polarization. In another or further embodiment, a predetermined or expected position of the (positionally fixed) reference marker Mr' is used for distinction.

In some embodiments, a marker position Xm',Ym' is determined based on the first subset Sm of the sensor elements. In other or further embodiments, a reference position Xr',Yr' is determined based on the second subset Sr of the sensor elements. In one embodiment, a predetermined shape of the respective marker is fitted to the positions of illuminated sensor elements to determine a position of the respective marker. In another or further embodiment, a centre or other point having a predetermined positional relation to the respective subset of sensor elements is used to obtain the respective marker position. In a preferred embodiment, as described herein, the object position Xm,Ym is determined based on the marker position Xm',Ym' relative to the reference position Xr',Yr'.

Aspects of the present disclosure can also be embodied as a method for aligning an object "O" having an object marker Mm. Some embodiments comprise projecting an image Mm' of the object marker Mm and at least one reference marker Mr' onto an imaging sensor 11 having sensor elements 11p. Other or further embodiments comprise determining, based on image output 11I from the imaging sensor 11, a first subset Sm of sensor elements and a second subset Sr of sensor elements illuminated by the image Mm' of the object marker and by the reference marker Mr', respectively. Other or further embodiments comprise determining a marker position Xm',Ym' where the image Mm' of the object marker is projected onto the imaging sensor 11. For example, the determination is based on the first subset Sm of the sensor elements. As will be appreciated, the marker position Xm',Ym' can correlate with a position Xm,Ym of the object "O". In some embodiments, a reference position Xr',Yr' where the reference marker Mr' is projected onto the imaging sensor 11 is determined based on the second subset Sr of the sensor elements. As will be appreciated, the reference position Xr',Yr' can be independent of the position Xm,Ym of the object "O". Accordingly, the object position Xm,Ym can be determined based on the marker position Xm',Ym' relative to the reference position Xr',Yr'.

In some embodiments, the alignment system 100 comprises an actuator configured to control a position of the object "O" relative to the imaging system 14. For example, the alignment system 100 comprises an object stage 26 for setting and/or adjusting the object position Xm,Ym relative to the imaging system 14, e.g. until the calculated position matches a desired position. Alternatively, or additionally, it can be envisaged to actuate (parts of) the imaging system 14.

In some embodiments, the reference marker Mr' is projected onto the imaging sensor 11 by a coherent light source, e.g. a laser, which can be used to project the marker also without projection optics. More preferably, the reference marker Mr' is projected by an imaging system, most preferably the same imaging system 14 as which projects the image of the object marker Mm', as described in the following.

Figure 2A:
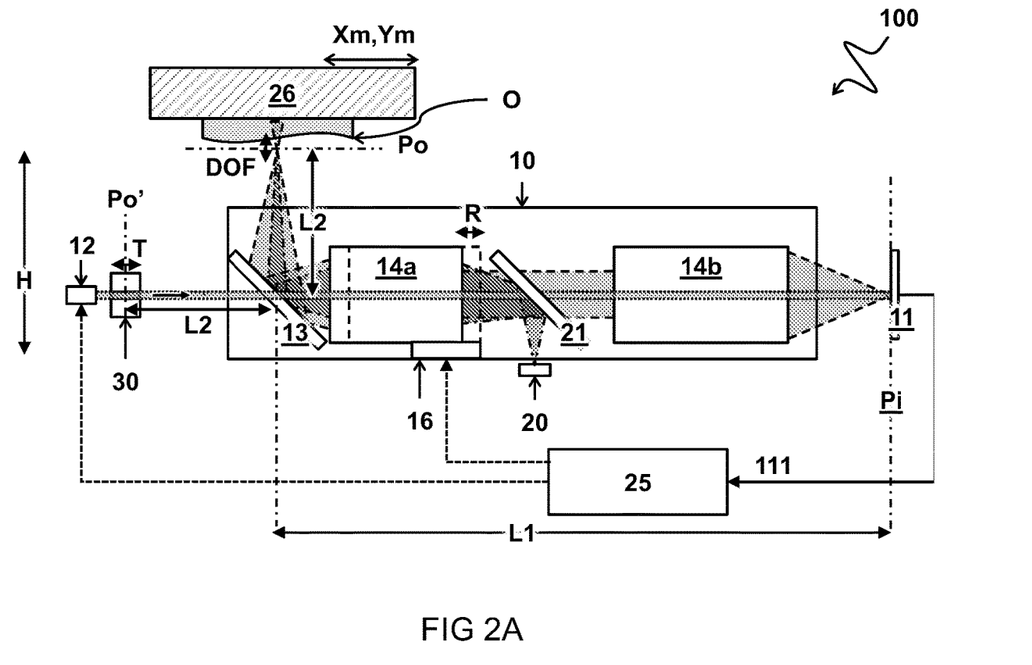
FIG. 2A illustrates other or further aspects of an alignment system.

FIG. 2A illustrates other or further aspects of an alignment system.

In some embodiments, the reference light source 12 is configured to emit a light beam through at least part, preferably all, of the imaging system 14 together with light from the object plane Po. For example, transmit through and/or reflect from one or more of the optical components. In other or further embodiments, the alignment system 100 comprises a folding mirror 13 arranged in a light path between the object plane Po and the imaging plane Pi. For example, the folding mirror 13 is disposed between the imaging system 14 and the object plane Po. In one embodiment, the folding mirror 13 is configured to fold the light at an angle, e.g. ninety degrees, from the object plane Po towards the imaging plane Pi. For example, a first part of the light path between the imaging plane Pi and the folding mirror 13, parallel to the object plane Po, has a first length L1. For example, a second part of the light path between the object plane Po and the folding mirror 13, transverse (e.g. normal) to the object plane Po, has a second length L2. In a preferred embodiment, the second length L2 is smaller than the first length L1, e.g. by at least a factor two, three, five, up to a factor ten, or more. In one embodiment the first part of the light path passes through some, preferably all, of the components (e.g. lenses) of the imaging system 14. As will be appreciated, the folding mirror 13 allows for a height "H" of the alignment system 100 as considered with respect to the object plane Po to be significantly smaller than the first length L1.

In some embodiments, the alignment system 100 comprises a beam combiner configured to receive a first light beam from the object plane Po and receive a second light beam from the reference light source 12. For example, the beam combiner is configured to combine the light beams towards the imaging sensor 11. In some embodiments, the light traverses the imaging system 14. In some embodiments, the beam combiner is configured to reflect or transmit light incident from the object plane Po towards the other components of the imaging system 10 and the imaging plane Pi. In other or further embodiments, the beam combiner is configured to reflect or transmit light incident from a secondary object plane Po' towards the other components of the imaging system 14 and the imaging plane Pi.

In a preferred embodiment, the beam combiner is formed by the folding mirror 13. For example, the beam combiner is disposed in place of the folding mirror 13 as described earlier. The beam combiner can also be a separate component, that is disposed in place of the folding mirror, or any other position along a light path between the object plane Po and imaging plane Pi. In some embodiments, the beam combiner is a dichroic mirror. This can be used to combine different wavelengths of light from the object marker Mm and the reference light source 12. For example, the dichroic mirror can reflect light incident from the object plane Po and transmit light incident from the reference light source 12, or vice versa. For example, light from the reference light source 12 has a first wavelength λ1 and light (reflected) from the marker has a second wavelength λ2, wherein the second wavelength is different from the first wavelength. Accordingly, the dichroic mirror can combine light with the different wavelengths, incident from different directions, into a common direction. In one embodiment, the first wavelength λ1 is determined by the reference light source 12. In another or further embodiment, the second wavelength λ2 is determined by environmental lighting conditions and/or a dedicated illumination light source 20 and/or light reflected by the marker. As will be appreciated, a dichroic mirror can be relatively efficient in passing light from the illumination light source 20 to the object "O" and back. Alternatively, or in addition to a dichroic mirror, also an (achromatic) beam splitter or combiner can be used (e.g. 50/50. 70/30). In this way the first wavelength λ1 of the reference light source 12 can be similar or close to the second wavelength λ2 reflected by the object marker Om In a preferred embodiment, the reference light source 12 is configured to emit incoherent light, e.g. an LED. The incoherent light can for example help alleviate artefacts associated with coherent light such as speckle. Typically however, light from an incoherent light source can provide limited directionality to the emitted light and/or an incoherent light source has a relatively large and diffuse distribution of light. In some embodiments (not shown), the reference light source is disposed in the secondary object plane Po'. In another or further embodiment, e.g. as shown, the alignment system 100 comprises a pinhole 30 between the reference light source 12 and the imaging system 14. In particular between the reference light source 12 and the beam combiner. As will be appreciated, the pinhole can be used to configure the emission of light into the imaging system 14 with its size and shape directly determining the imaged reference marker Mr'. In a preferred embodiment, the pinhole 30 has an extended thickness T for collimating the light from the reference light source 12. By collimating the light, sensitivity to focal settings of the imaging system 14 can be alleviated. In a preferred embodiment, the pinhole is arranged at a secondary object plane Po' of the imaging system 14, and, as shown, at the same distance L2 from the folding mirror 13 as the object plane Po. In another or further preferred embodiment, the thickness T of the pinhole (30) is equal or larger than a depth of focus DOF of the imaging system 14 in the object plane Po. For example, the depth of focus can be calculated using $t=2 \cdot N \cdot c \cdot (1+M)$, where "t" is the total depth of focus, "N" is the f-number, c is the circle of confusion, and "M" is the magnification of the lens and/or imaging system. For example, the thickness "T" or length of the pinhole is at least half a millimeter, one millimeter, two millimeter, three millimeter, five millimeter, one centimeter, or more.

In some embodiments, e.g. as shown, the alignment system 100 comprises an actuator 16, e.g. linear stage, configured to move one or more components of the imaging system 14, to adjust focusing of the image of the object marker on the imaging sensor 11. For example, the linear stage is configured to move one or more components of the imaging system. Preferably, the thickness T of the pinhole 30 is at least equal to a range R over which the actuator 16 is configured to adjust the object plane Po and the secondary object plane Po' to focus the image on the imaging sensor 11. In this way, the thickness T can alleviate sensitivity of the system to the focus position of the actuator 16.

In some embodiments, the alignment system (100) comprises an illumination light source 20 configured to illuminate the object "O" in the object plane Po. For example, through at least part of the complete imaging system 14, as shown in FIG. 2A. In another or further embodiment, the alignment system 100 comprises a beam splitter 21 configured to reflect at least some of the light incident from the light source 20 towards the object plane Po. For example, the beam splitter transmits at least some of the light incident from the object plane Po and secondary object plane Po' towards the imaging sensor 11. For example, the beam splitter 21 is formed by a 50/50 beam splitter, polarizer, et cetera. In some embodiments, e.g. as shown in FIG. 2A, the beam splitter 21 is disposed between optical components 14a,14b of the imaging system 14. In other or further embodiments, the beam splitter 21 is disposed between the imaging system 14 and the imaging sensor 11.

Figure 2B:
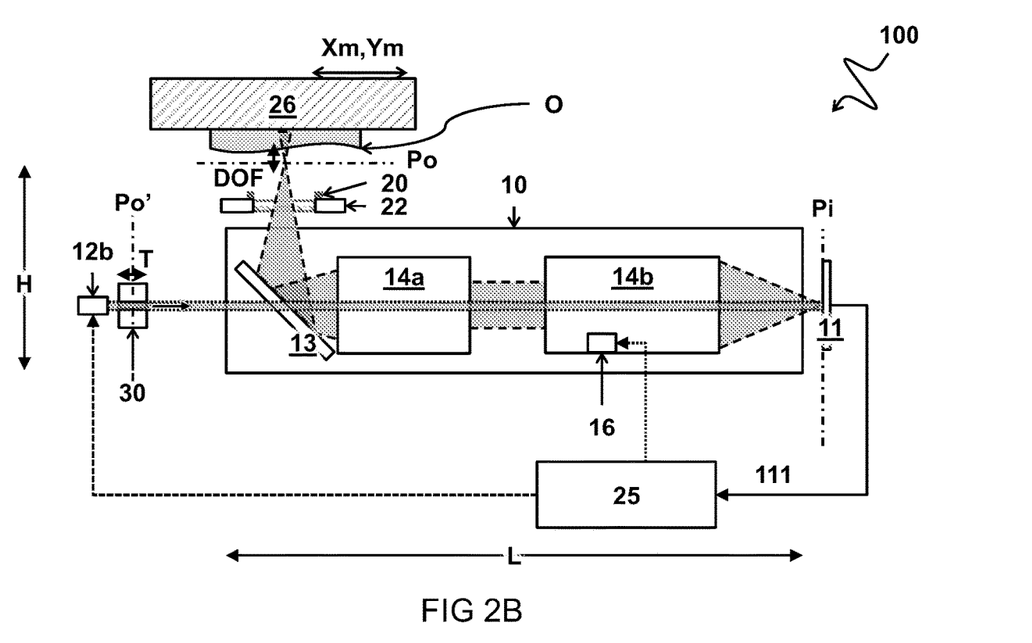
FIG. 2B illustrates an embodiment of the system

FIG. 2B illustrates other or further aspects of an alignment system. In some embodiments, e.g. as shown, the illumination light source 20 is configured to directly illuminate the object "O". In other or further embodiments, the alignment system 100 comprises multiple illumination light sources 20 surrounding an aperture. For example, the one or more light sources 20 are disposed on a circuit board 22 facing the alignment object O. For example, the object marker Mm is imaged by the imaging system 14 through an aperture of the circuit board 22. The aperture of the circuit board 22, is for example larger than the diameter of the entrance pupil of the imaging system 14. In this way, light incident from the object plane Po towards the imaging plane Pi can be free from obstruction.

In some embodiments, the alignment system 100 comprises a processor 25 configured and/or programmed to perform operational acts in accordance with the present methods and systems. In one embodiment, the processor 25 is configured, e.g. programmed, to analyze the image output 111 from the imaging sensor 11, e.g. for determining the marker and/or reference positions. In another or further embodiment, the processor 25 is configured to control one or more of the reference light source 12, imaging system 14, actuator 16, illumination light source 20, object stage 26, or parts thereof (e.g. respective actuator). Some aspects, of the present disclosure can be embodied as a non-transitory computer-readable medium storing instructions that, when executed by one or more processors, cause a device to perform method as described herein. For example, the processor can be under software and/or hardware control.

Figure 3A:
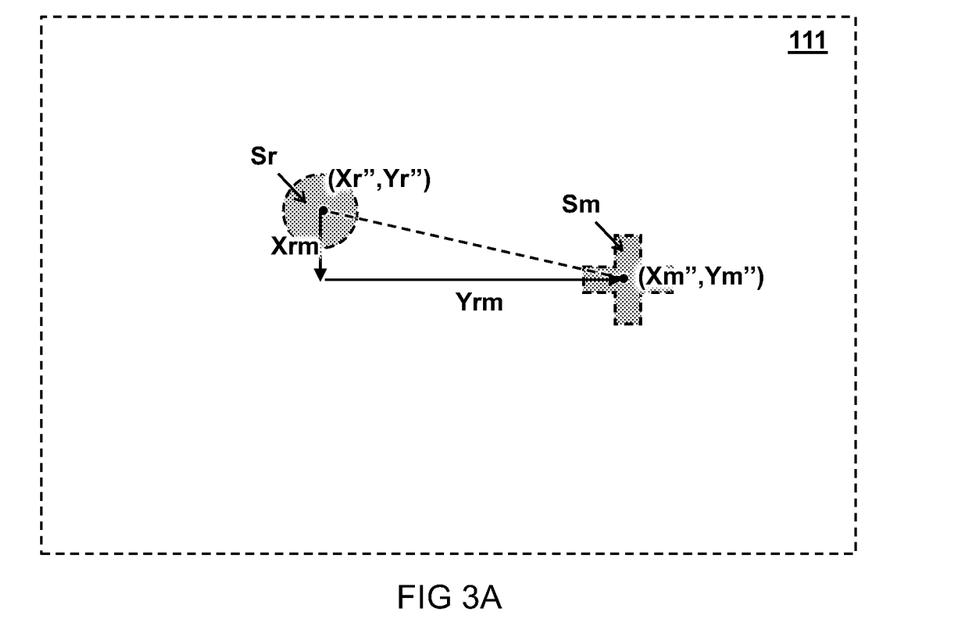
FIG. 3A illustrates determining a measured marker position relative to a measured reference position.

FIG. 3A illustrates determining a measured marker position Xm",Ym" relative to a measured reference position Xr",Yr", e.g. pixel coordinates. For example, the coordinates can be derived from the respective first subset Sm and second subset Sr of the sensor elements where the image of the object marker and the reference marker are measured. In some embodiments, the measured marker and/or reference position can be derived by determining a center of the respective pixel coordinates of the respective subset. Alternatively, other derivations can also be made, e.g. depending on a shape of the respective marker. Subsequently, from the measured marker position Xm",Ym" and the measured reference position Xr",Yr" a relative distance Xrm,Yrm between the respective positions can be determined. Thereafter, the object position Xm,Ym can be determined, e.g. calculated based on the relative distance Xrm,Yrm.

In some embodiments, the object marker Mm and the reference marker Mr' are identified based on, for example, a difference in shapes between the respective markers, e.g. using a shape recognition algorithm such as shape fitting, machine learning, et cetera. Alternatively, or in addition, the illumination light source 20 and the reference light source 12 can be intensity modulated, e.g. turned on or off, making the respective markers (more) visible in a specific timeframe. Alternatively or in addition, moving the object can allow recognition of the object marker as the positions can be correlated. In one embodiment, a first coordinate of the object position is based on the relative distance Xrm along a row of the sensor elements 11p. Furthermore, a second coordinate of the object position can be based on the relative distance Yrm along a column of the sensor elements 11p. Typically, the column of sensor elements 11p is transverse to the row of the sensor elements 11p.

Figure 3B:
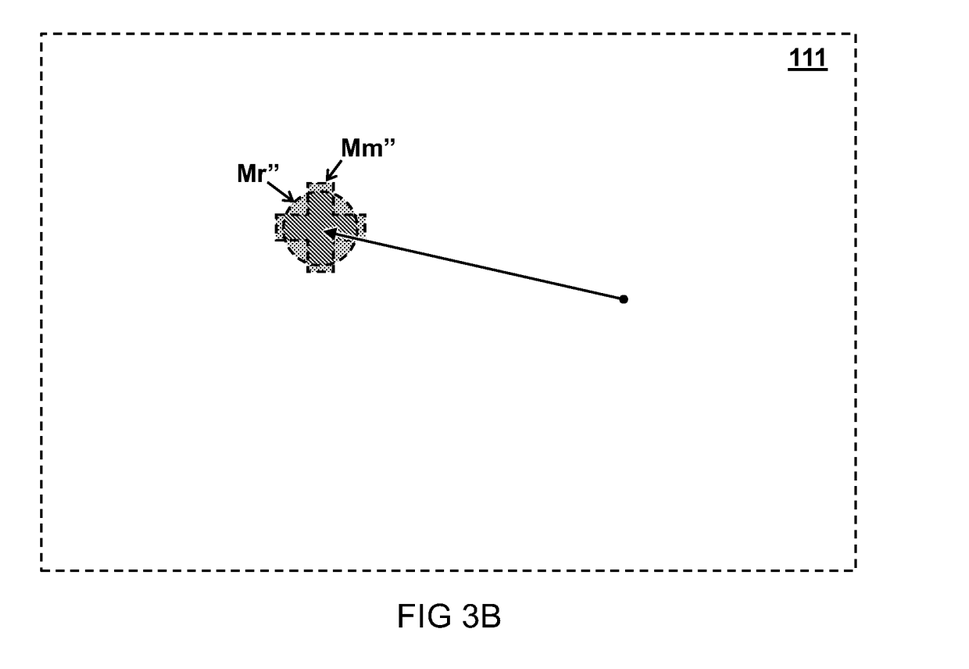
FIG. 3B illustrates determining a measured marker position relative to a measured reference marker and using the relation to overlap the respective markers.

FIG. 3B illustrates determining a measured marker position relative to a measured reference marker and using the relation to overlap the respective markers. In one embodiment, an object stage (e.g. shown in FIGS. 1 and 2) is configured to hold the object and to adjust the object position towards overlapping the image Mm" of the object marker with the reference marker Mr'. For example, the two markers have shapes which overlap perfectly, e.g. two circles with the same size, wherein overlapping comprises minimizing the total surface area. Alternatively the two markers can be shaped as two distinct shapes that are both visible at the same time while they overlap, from which a centre point is determined. For example, a plus and a cross that align based on respective orientations and centre points. In one embodiment, the object marker Mm is shaped as an outline of a plus-shape which is slightly larger than a plus-shape of the reference marker Mr' to align the object marker Mm as an outline of the reference marker Mr'. In another embodiment, e.g. as shown, the reference marker Mr' is shaped as a circle overlapping the plus shape of the image Mm" of the object marker, while both are visible.

Figure 4A:
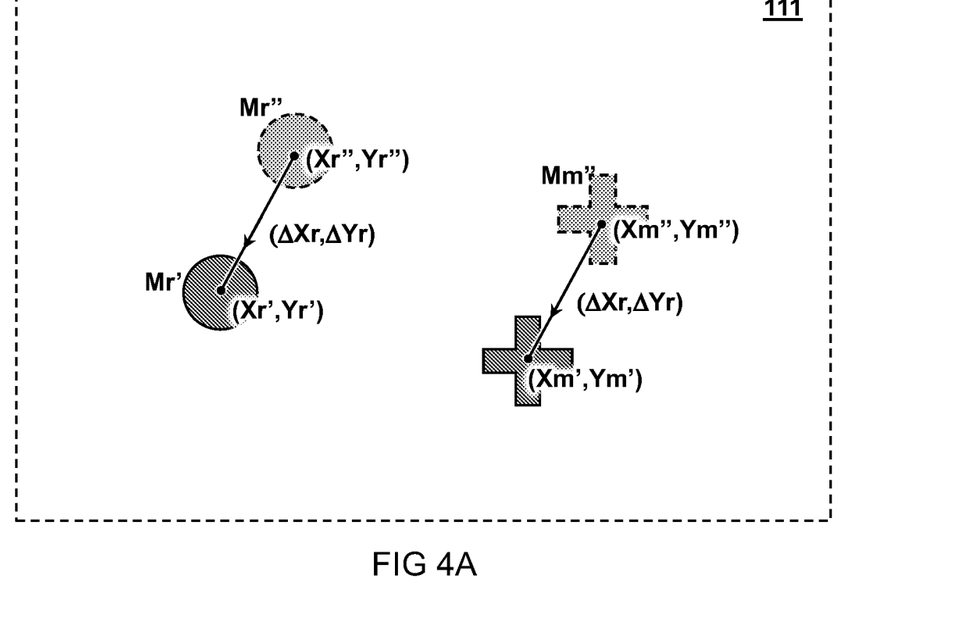
FIG. 4A illustrates correcting a measured marker position using a reference offset.

FIG. 4A illustrates correcting a measured marker position using a reference offset $\Delta Xr,\Delta Yr$. For example, this offset is between a measured reference position Xr",Yr" (where the reference marker is measured to illuminate the sensor elements) and a calibrated reference position Xr',Yr'. In another or further embodiment, the calibrated reference position is where the reference marker is expected to illuminate the imaging sensor. For example, this is determined by measuring the position of the reference marker Mr' when the imaging sensor is not heated or during calibration. In some embodiments, the reference offset $\Delta Xr,\Delta Yr$ is measured and applied to correct the measured marker position Xm",Ym" of the image Mm" of the object marker. Subsequently, using the reference offset $\Delta Xr,\Delta Yr$, the (corrected) marker position Xm',Ym' can be determined to determine the object position.

Figure 4B:
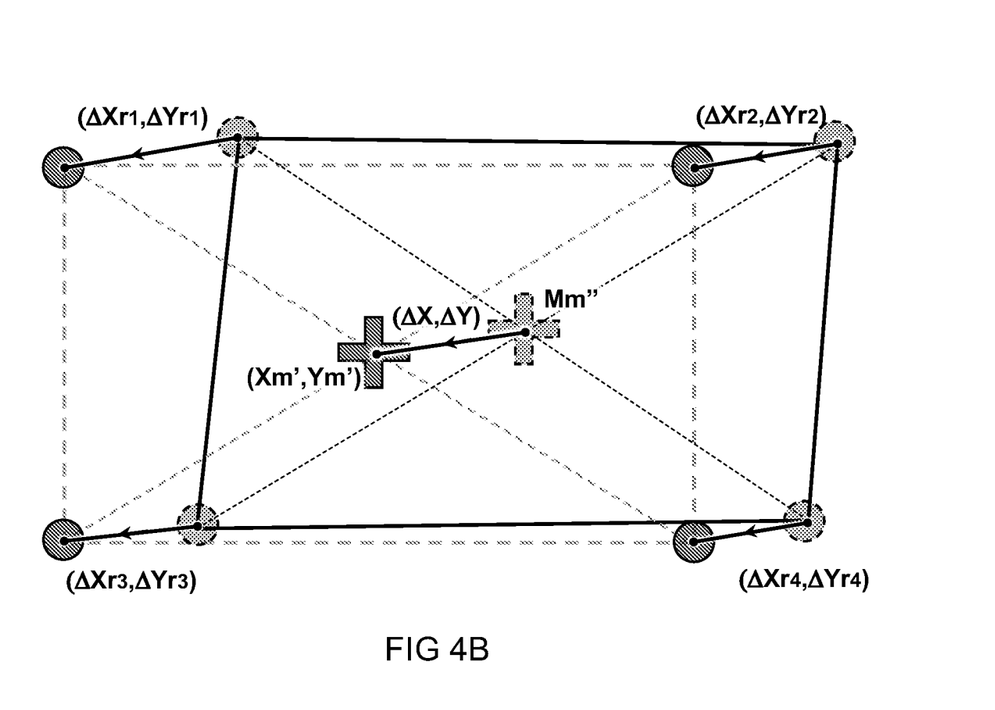
FIG. 4B illustrates correcting a measured marker position using multiple reference offsets.

FIG. 4B illustrates correcting a measured marker position using multiple reference offsets $\Delta Xr_{1,2,3,4}$; $\Delta Yr_{1,2,3,4}$. In some embodiments, the multiple reference offsets are determined using multiple reference markers and corresponding calibrated reference positions. The multiple reference offsets can be used to correct the marker position Xm',Ym'. For example, the set of reference markers is arranged to span an area containing the image Mm" of the object marker. The offset $\Delta X,\Delta Y$ of the marker position Xm',Ym' can be based on interpolation of the multiple reference offsets. It can also be envisaged to use one large reference marker spanning the area.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. An alignment system for aligning an object, the system comprising,
    an imaging sensor with sensor elements;
    an imaging system having an object plane and an imaging plane, and comprising one or more optical components configured to receive light from at least one object marker defining a respective object position of the object in the object plane, and to project an image of the object marker at a marker position onto the imaging sensor, thereby illuminating a first subset of the sensor elements in the imaging plane, wherein the marker position in the imaging plane correlates with the object position in the object plane;
    a reference light source configured to project at least one reference marker at a reference position onto the imaging sensor, thereby illuminating a second subset of the sensor elements, wherein the reference position in the imaging plane is independent of the object position in the object plane; and
    a processor configured to
        determine, based on image output from the imaging sensor, the first subset of the sensor elements and the second subset of the sensor elements illuminated by the image of the object marker and by the reference marker, respectively,
        determine the marker position based on the first subset of the sensor elements,
        determine the reference position based on the second subset of the sensor elements, and
        calculate, the object position based on the marker position relative to the reference position.

2. The alignment system according to claim 1, wherein the reference light source is configured to project the reference marker through the imaging system.

3. The alignment system according to claim 2, comprising a folding mirror arranged in a light path between the object plane and the imaging plane, wherein
    a first part of the light path between the imaging plane and the folding mirror, parallel to the object plane, has a first length, and
    a second part of the light path between the object plane and the folding mirror normal to the object plane, has a second length,
    wherein the second length is smaller than the first length by at least a factor two.

4. The alignment system according to claim 3, wherein the folding mirror forms a beam combiner configured to receive a first light beam from the object plane, receive a second light beam from the reference light source, and combine the first and second light beams towards the imaging sensor via the imaging system.

5. The alignment system according to claim 4, wherein the folding mirror is a dichroic mirror, configured to combine different wavelengths of light from the object marker and the reference light source.

6. The alignment system according to claim 1, comprising a pinhole arranged at a secondary object plane of the imaging system between the reference light source and the imaging system, wherein the reference light source is configured to emit incoherent light through the pinhole to be imaged as the reference marker by the imaging system, wherein the pinhole has an extended thickness for collimating the light from the reference light source.

7. The alignment system according to claim 6, comprising an actuator configured to move one or more optical components of the imaging system, to adjust focusing of the image of the object marker on the imaging sensor, wherein the thickness of the pinhole is at least equal to a range over which the actuator is configured to adjust the object plane and the secondary object plane to focus the image on the imaging sensor.

8. The alignment system according to claim 1, wherein the processor is configured to identify the object marker and the reference marker based on
    a difference in shapes between the respective markers; and/or
    modulating an intensity of one or both of the reference light source and an illumination light sources, illuminating the object.

9. The alignment system according to claim 1, wherein the processor is configured to determine the object position by
    determining a reference offset between
        a measured reference position where the reference marker is measured to illuminate the sensor elements, and
        a calibrated reference position; and
    applying the reference offset to correct the measured marker position of the image of the object marker for calculating the object position.

10. The alignment system according to claim 9, wherein a set of multiple reference offsets is determined using multiple reference markers and corresponding calibrated reference positions, wherein the multiple reference offsets are used to correct the marker position, wherein the set of reference markers is arranged to span an area containing the image of the object marker, wherein an offset of the marker position is based on interpolation of the multiple reference offsets.

11. The alignment system according to claim 9, wherein the alignment system comprises an object stage configured to control a position of the object relative to the imaging system based on the calculated object position.

12. The alignment system according to claim 11, wherein the processor is configured to control the object stage to adjust the object position towards overlapping the image of the object marker with the reference marker.

13. The alignment system according to claim 1, wherein the object position is determined by
    determining a measured marker position derived from the first subset of the sensor elements where the image of the object marker is measured;
    determining a measured reference position derived from the second subset of the sensor elements where the reference marker is measured;
    determining a relative distance between the measured marker position and the measured reference position; and
    calculating the object position based on the relative distance,
    wherein
        a first coordinate of the object position is based on the relative distance along a row of the sensor elements, and
        a second coordinate of the object position is based on the relative distance along a column of the sensor elements.

14. The alignment system according to claim 1, comprising a set of illumination light sources configured to illuminate the object in the object plane, wherein the illumination light sources are arranged on a circuit board facing the alignment system, wherein the illumination light sources are arranged surrounding an aperture through the circuit board, wherein the object marker is imaged by the imaging system via a light path through the aperture.

15. A method for aligning an object having an object marker, the method comprising,
    projecting an image of the object marker onto an imaging sensor having sensor elements;
    projecting at least one reference marker onto the imaging sensor;
    determining, based on image output from the imaging sensor, a first subset of sensor elements and a second subset of sensor elements illuminated by the image of the object marker and by the reference marker, respectively,
    based on the first subset of the sensor elements, determining a marker position where the image of the object marker is projected onto the imaging sensor, wherein the marker position correlates with a position of the object;
    based on the second subset of the sensor elements, determining a reference position where the reference marker is projected onto the imaging sensor, wherein the reference position is independent of the position of the object; and
    determining the object position based on the marker position relative to the reference position.

16. The method according to claim 15, wherein the at least one reference marker is projected by a reference light source through an imaging system projecting the image of the object marker.

17. The method according to claim 16, wherein a folding mirror is arranged in a light path between an object plane and an imaging plane of the imaging system, wherein
    a first part of the light path between the imaging plane and the folding mirror, parallel to the object plane, has a first length, and
    a second part of the light path between the object plane and the folding mirror normal to the object plane, has a second length,
    wherein the second length is smaller than the first length by at least a factor two.

18. The method according to claim 17, wherein the folding mirror forms a beam combiner configured to receive a first light beam from the object plane, receive a second light beam from the reference light source, and combine the first and second light beams towards the imaging sensor via the imaging system.

19. The method according to claim 18, wherein the folding mirror is a dichroic mirror, configured to combine different wavelengths of light from the object marker and the reference light source.

20. The method according to claim 15, wherein the object is aligned at an object plane, wherein the image of the object marker is projected by an imaging system onto the imaging sensor disposed in an imaging plane of the imaging system, wherein the at least one reference marker is projected by a reference light source, wherein a pinhole is arranged at a secondary object plane of the imaging system between the reference light source and the imaging system, wherein the reference light source is configured to emit incoherent light through the pinhole to be imaged as the reference marker by the imaging system, wherein the pinhole has an extended thickness for collimating the light from the reference light source.

* * * * *